US007269026B2

(12) United States Patent
Jeong (10) Patent No.: US 7,269,026 B2
(45) Date of Patent: Sep. 11, 2007

(54) PLASMA DISPLAY APPARATUS (75) Inventor: Kwang-Jin Jeong, Suwon-si (KR)

(73) Assignee: Samsung SDI Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 11/295,547

(22) Filed: Dec. 7, 2005

(65) Prior Publication Data

US 2006/0126314 A1    Jun. 15, 2006

(30) Foreign Application Priority Data

Dec. 15, 2004   (KR) ...................... 10-2004-0106208

(51) Int. Cl.
*H05K 7/00* (2006.01)
(52) U.S. Cl. ...................... 361/760; 361/681; 361/697; 361/748; 361/801; 174/351; 174/384; 313/582; 313/583
(58) Field of Classification Search ................ 361/420, 361/679–687, 695–719, 760, 799–818, 748; 174/351, 384; 313/582, 583; 349/58; 439/493
See application file for complete search history.

(56) References Cited

U.S. PATENT DOCUMENTS

| 4,567,546 | A | * | 1/1986 | Zeller et al. ................. 361/810 |
| 4,589,794 | A | * | 5/1986 | Sugiura et al. ............. 403/187 |
| 4,627,760 | A | * | 12/1986 | Yagi et al. .................. 403/201 |
| 5,541,618 | A | | 7/1996 | Shinoda |
| 5,661,500 | A | | 8/1997 | Shinoda et al. |
| 5,663,741 | A | | 9/1997 | Kanazawa |
| 5,674,553 | A | | 10/1997 | Shinoda et al. |
| 5,724,054 | A | | 3/1998 | Shinoda |

(Continued)

FOREIGN PATENT DOCUMENTS

JP        2845183        10/1998

(Continued)

OTHER PUBLICATIONS

"*Final Draft International Standard*", Project No. 47C/61988-1/Ed. 1; Plasma Display Panels—Part 1: Terminology and letter symbols, published by International Electrotechnical Commission, IEC. in 2003, and Appendix A—Description of Technology, Annex B—Relationship Between Voltage Terms And Discharge Characteristics; Annex C—Gaps and Annex D—Manufacturing.

*Primary Examiner*—Dean A. Reichard
*Assistant Examiner*—Xiaoliang Chen
(74) *Attorney, Agent, or Firm*—Robert E. Bushnell, Esq.

(57) ABSTRACT

A plasma display apparatus includes: a Plasma Display Panel (PDP) adapted to display images; a chassis base arranged on a rear portion of the PDP; printed circuit boards arranged on a rear portion of the chassis base and adapted to drive the PDP, the printed circuit boards including substrate connectors respectively arranged at front portions thereof; and connection cables adapted to electrically connect the PDP to the printed circuit boards and to electrically connect the printed circuit boards to each other, the connection cables including a wiring member and a cable connector having two sides. One side of the cable connector is affixed to the chassis base and the other side of the cable connector is coupled to one of the substrate connectors and to at least an end of the wiring member.

10 Claims, 5 Drawing Sheets

U.S. PATENT DOCUMENTS

| | | |
|---|---|---|
| 5,786,794 A | 7/1998 | Kishi et al. |
| 5,952,782 A | 9/1999 | Nanto |
| 6,176,734 B1* | 1/2001 | Juntwait et al. ............ 439/493 |
| RE37,444 E | 11/2001 | Kanazawa |
| 6,445,373 B1* | 9/2002 | Yamamoto .................. 345/102 |
| 6,630,916 B1 | 10/2003 | Shinoda |
| 6,707,436 B2 | 3/2004 | Setoguchi et al. |
| 2002/0031932 A1* | 3/2002 | Fukumoto et al. .......... 439/267 |
| 2002/0041155 A1* | 4/2002 | Asami et al. ............... 313/583 |
| 2002/0067591 A1* | 6/2002 | Tajima ....................... 361/681 |
| 2004/0027073 A1* | 2/2004 | Nomoto et al. ............. 313/583 |
| 2004/0232838 A1* | 11/2004 | Masuda et al. ............. 313/582 |
| 2005/0067963 A1* | 3/2005 | Kim et al. .................. 313/583 |
| 2005/0068261 A1* | 3/2005 | Oh .............................. 345/60 |
| 2005/0111175 A1* | 5/2005 | Kim ........................... 361/681 |
| 2005/0194913 A1* | 9/2005 | Kim et al. ............... 315/169.4 |
| 2005/0258749 A1* | 11/2005 | Ahn ........................... 313/582 |
| 2005/0286228 A1* | 12/2005 | Kim ........................... 361/704 |
| 2006/0044745 A1* | 3/2006 | Kim ........................... 361/681 |
| 2006/0077635 A1* | 4/2006 | Kim et al. .................. 361/688 |
| 2006/0089023 A1* | 4/2006 | Kim ............................. 439/96 |
| 2006/0098135 A1* | 5/2006 | Kim ............................. 349/58 |
| 2006/0098412 A1* | 5/2006 | Kim et al. .................. 361/704 |
| 2006/0098415 A1* | 5/2006 | Kim et al. .................. 361/740 |
| 2006/0133046 A1* | 6/2006 | Kim et al. .................. 361/714 |
| 2006/0158845 A1* | 7/2006 | Kim ........................... 361/687 |

FOREIGN PATENT DOCUMENTS

| | | |
|---|---|---|
| JP | 2917279 | 4/1999 |
| JP | 2001-043804 | 2/2001 |
| JP | 2001-325888 | 11/2001 |

* cited by examiner

PLASMA DISPLAY APPARATUS

CLAIM OF PRIORITY

This application makes reference to, incorporates the same herein, and claims all benefit accruing under 35 U.S.C. §119 from an application for PLASMA DISPLAY APPARATUS earlier filed in the Korean Intellectual Property Office on 15 Dec. 2004 and there duly assigned Serial No. 10-2004-0106208.

BACKGROUND OF THE INVENTION

1. Field of the Invention

The present invention relates to a plasma display apparatus, and more particularly, to a plasma display apparatus having an improved coupling structure between a chassis base and a printed circuit board.

2. Description of the Related Art

A plasma display apparatus is a flat panel display apparatus for displaying images using a gas discharge phenomenon. The plasma display apparatus has superior display capacity, brightness, contrast, residual image, and viewing angle, and can constitute a thin large screen display. Thus, the plasma display apparatus is considered to be a next generation flat panel display that can substitute for a Cathode Ray Tube (CRT).

The plasma display apparatus includes a Plasma Display Panel (PDP), a chassis base disposed in parallel to the PDP, printed circuit boards mounted on a back portion of the chassis base to drive the PDP, and a case receiving the PDP, the chassis base, and the printed circuit boards.

In addition, on the printed circuit board driving the PDP, various devices are included. The printed circuit board is mounted on the chassis base. The chassis base includes bosses protruding toward the printed circuit boards, and screw recesses respectively formed on the bosses. The printed circuit boards include coupling holes corresponding to the bosses. A screw is inserted through the coupling hole and coupled to the screw recess of the boss, and thus, the chassis base and the printed circuit board are fixedly coupled to each other. The printed circuit boards mounted on the chassis base are electrically connected to each other by connection cables.

However, in order to mount the printed circuit board on the chassis base, the screw passes through the coupling hole of the printed circuit board and is rotated to be coupled to the screw recess of the boss. However, it takes a lot of time to rotate the screw, and the printed circuit board can be damaged by a mistake of an operator. In addition, since a plurality of bosses are formed on the chassis base, processes and costs for forming the bosses on the chassis base must be added. Moreover, the connection cable connecting the printed circuit boards is fixedly attached to the chassis base for reducing ElectroMagnetic Interference (EMI), and accordingly, processes and costs for performing the attaching process increase.

SUMMARY OF THE INVENTION

The present invention provides a plasma display apparatus capable of improving assembly between printed circuit boards and a chassis base by installing a connection cable connecting the printed circuit boards on the chassis base.

According to an aspect of the present invention, a plasma display apparatus is provided including: a Plasma Display Panel (PDP) adapted to display images; a chassis base arranged on a rear portion of the PDP; printed circuit boards arranged on a rear portion of the chassis base and adapted to drive the PDP, the printed circuit boards including substrate connectors respectively arranged at front portions thereof; and connection cables adapted to electrically connect the PDP to the printed circuit boards and to electrically connect the printed circuit boards to each other, the connection cables including a wiring member and a cable connector having two sides. One side of the cable connector is affixed to the chassis base and the other side of the cable connector is coupled to one of the substrate connectors and to at least an end of the wiring member.

The chassis base and the cable connector are preferably affixed to each other by a mechanical joint.

The chassis base and the cable connector are preferably affixed to each other by an insertion hole arranged on the chassis base and a pair of fixing units arranged as hooks separated from each other, the hooks adapted to be inserted into both edges of the insertion hole.

The chassis base and the cable connector are preferably affixed to each other by double-sided adhesive tape interposed therebetween.

One of the substrate connectors and the cable connectors preferably includes a socket connector and the other of the substrate connectors and the cable connectors includes a plug connector. One substrate connector and one cable connector are preferably coupled to each other.

One of the substrate connectors and the cable connector preferably includes terminals holes, and the other of the substrate connectors and the cable connectors includes terminal pins adapted to be respectively inserted into the terminal holes.

The wiring member preferably contacts the chassis base and is arranged parallel to the chassis base.

Each printed circuit board is preferably mounted onto the chassis base by coupling the substrate connector arranged on the printed circuit board to the cable connector arranged on the connection cable.

The apparatus preferably further includes an auxiliary coupling unit adapted to assist mounting the printed circuit board on the chassis base.

The auxiliary coupling unit preferably includes a boss formed on a rear surface of the chassis base, and a screw penetrating the printed circuit board and adapted to be coupled to the boss.

BRIEF DESCRIPTION OF THE DRAWINGS

A more complete appreciation of the present invention, and many of the attendant advantages thereof, will be readily apparent as the present invention becomes better understood by reference to the following detailed description when considered in conjunction with the accompanying drawings in which like reference symbols indicate the same or similar components, wherein.

DETAILED DESCRIPTION OF THE INVENTION

The plasma display apparatus includes a Plasma Display Panel (PDP), a chassis base disposed in parallel to the PDP, printed circuit boards mounted on a back portion of the chassis base to drive the PDP, and a case receiving the PDP, the chassis base, and the printed circuit boards. One of the printed circuit boards is mounted on the chassis base as shown in FIG. 1.

Figure 1:
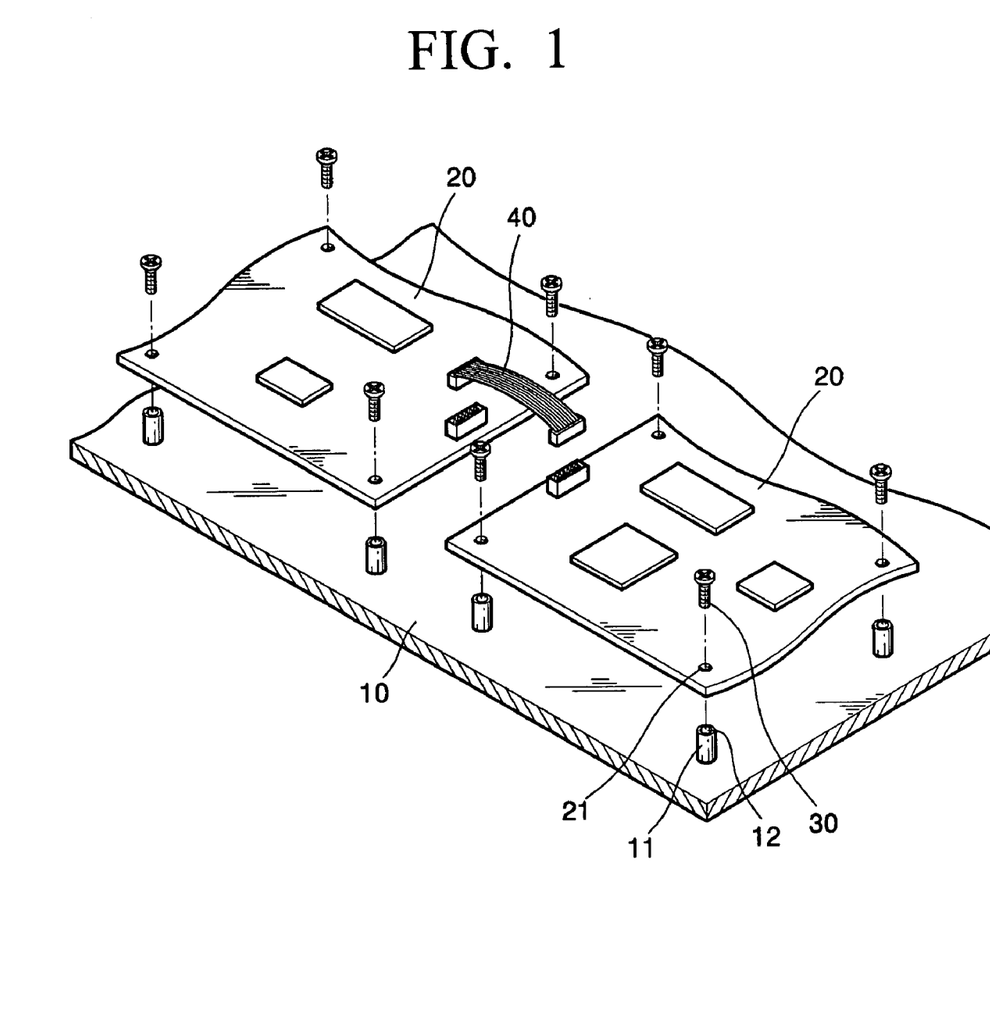
FIG. 1 is an exploded perspective view of printed circuit boards installed on a chassis base.

Referring to FIG. 1, the chassis base 10 includes bosses 11 protruding toward the printed circuit boards 20, and screw recesses 12 respectively formed on the bosses 11. The printed circuit boards 20 includes coupling holes 21 corresponding to the bosses 11. A screw 30 is inserted through the coupling hole 21 and coupled to the screw recess 12 of the boss 11, and thus, the chassis base 10 and the printed circuit board 20 are fixedly coupled to each other. The printed circuit boards 20 mounted on the chassis base 10 are electrically connected to each other by connection cables 40.

However, in order to mount the printed circuit board 20 on the chassis base 10, the screw 30 passes through the coupling hole 21 of the printed circuit board 20 and is rotated to be coupled to the screw recess 12 of the boss 11. However, it takes a lot of time to rotate the screw 30, and the printed circuit board 20 can be damaged by a mistake of an operator. In addition, since a plurality of bosses 11 are formed on the chassis base 20, processes and costs for forming the bosses 11 on the chassis base 10 must be added. Moreover, the connection cable 40 connecting the printed circuit boards 20 is fixedly attached to the chassis base 20 for reducing ElectroMagnetic Interference (EMI), and accordingly, processes and costs for performing the attaching process increase.

Figure 2:
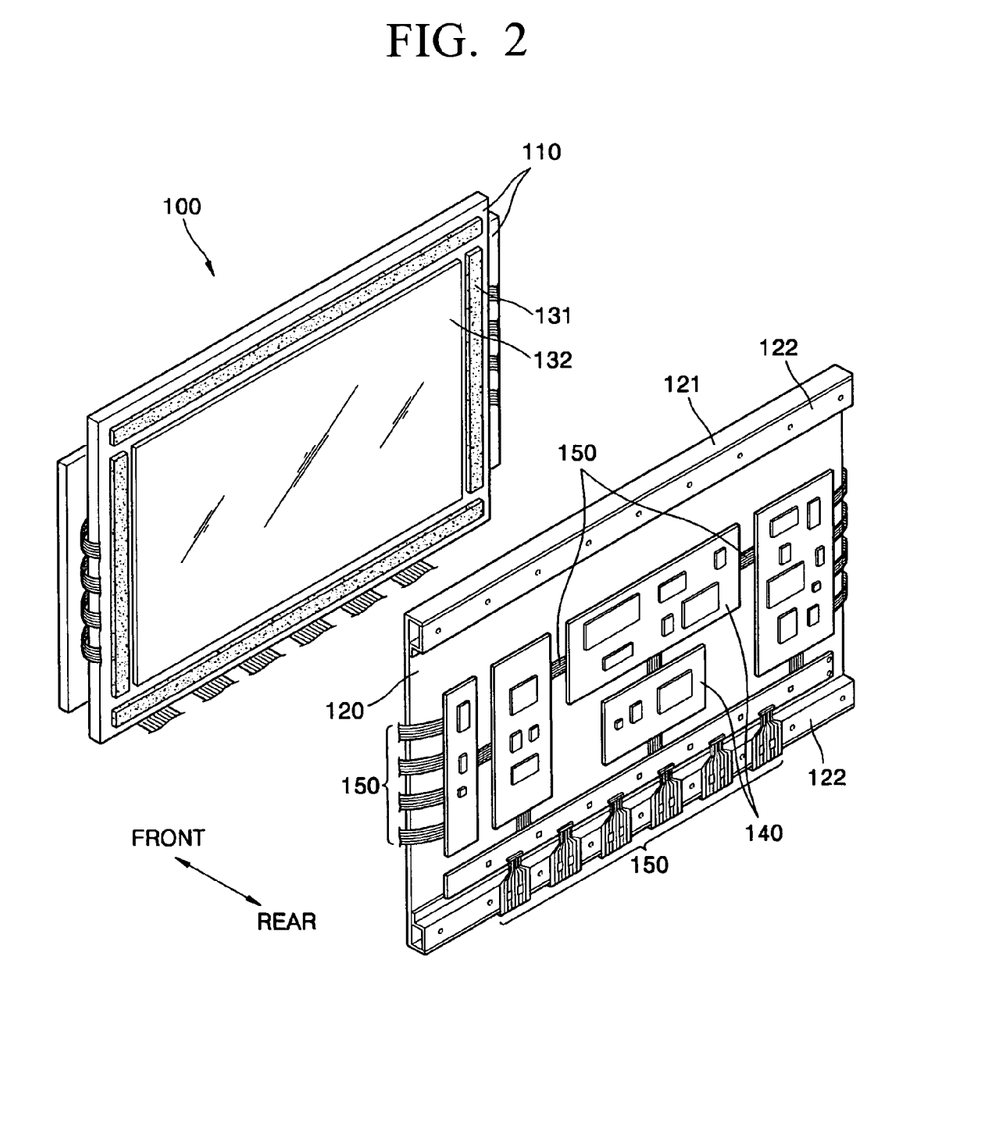
FIG. 2 is an exploded perspective view of a plasma display apparatus according to an embodiment of the present invention.

FIG. 2 is an exploded perspective view of a plasma display apparatus according to an embodiment of the present invention.

Referring to FIG. 2, the PDP 100 according to an embodiment of the present invention includes a PDP 110 to display images.

The PDP 110 can be various types of PDPs, for example, an Alternating Current (AC) PDP having three-electrode surface discharge structure can be used.

The AC PDP having the three-electrode surface discharge structure includes a front panel, and a rear panel facing the front panel and coupled to the front panel. The front panel includes a front substrate disposed at the front portion, pairs of sustain electrodes, each of which includes a common electrode and a scan electrode, formed on a rear surface of the front substrate, a front dielectric layer formed to cover the sustain electrode pairs, and a protective layer formed on a rear surface of the front dielectric layer. The rear panel coupled to the front panel includes a rear substrate disposed at the rear portion, address electrodes formed on a front surface of the rear substrate and extending in a direction of crossing the sustain electrode pairs, a rear dielectric layer formed to cover the address electrodes, barrier ribs formed on a front surface of the rear dielectric layer to define discharge spaces, and a phosphor layer disposed in the discharge spaces. The discharge spaces correspond to regions where the sustain electrode pairs and the address electrodes cross each other. A discharge gas is contained within the discharge spaces.

A chassis base 120 is disposed at a rear portion of the PDP 110 having the above structure. The chassis base 120, which can be formed of aluminum, for example, supports the PDP 110 and dissipates the heat generated by the PDP 110 to the outside. The chassis base 120 can include a bending portion 121 that is bent backward at an edge thereof in order to prevent bending or curving distortion, and to increase an area for dissipating the heat from the chassis base 120. Reinforcing members 122 can be installed on a rear portion of the chassis base 120. Each reinforcing member 122 is formed of a metal and is coupled to the rear surface of the chassis base 120 to prevent the chassis base 120 from being bent or curved, and increases the heat dissipating area of the chassis base 120 to improve the heat dissipation efficiency.

The chassis base 120 is coupled to the PDP 110 by an adhesive member 131, such as a double-sided adhesive tape, and a heat conductive medium 132 is disposed between the chassis base 120 and the PDP 110 to dissipate the heat generated by the PDP 110 to the outside.

In addition, a plurality of printed circuit boards 140 are installed on the rear portion of the chassis base 120 to drive the PDP 110. The printed circuit boards 140 are received by a case (not shown) together with the PDP 110 and the chassis base 120 to constitute the plasma display apparatus 100.

Various electronic elements 141 are mounted on the printed circuit boards 140 for driving the PDP 110, and the electronic elements 141 include elements for supplying power to the PDP 110, and elements for supplying signals to the PDP 110 for displaying images. That is, the printed circuit boards 140 include a power source substrate for receiving power from the outside and for converting the power into the power of required form, a logic substrate for logically calculating image signals supplied from the outside to convert the image signals to be suitable for the driving of the PDP 110, and a buffer substrate for temporarily storing the data processed by the logic substrate.

Figure 3:
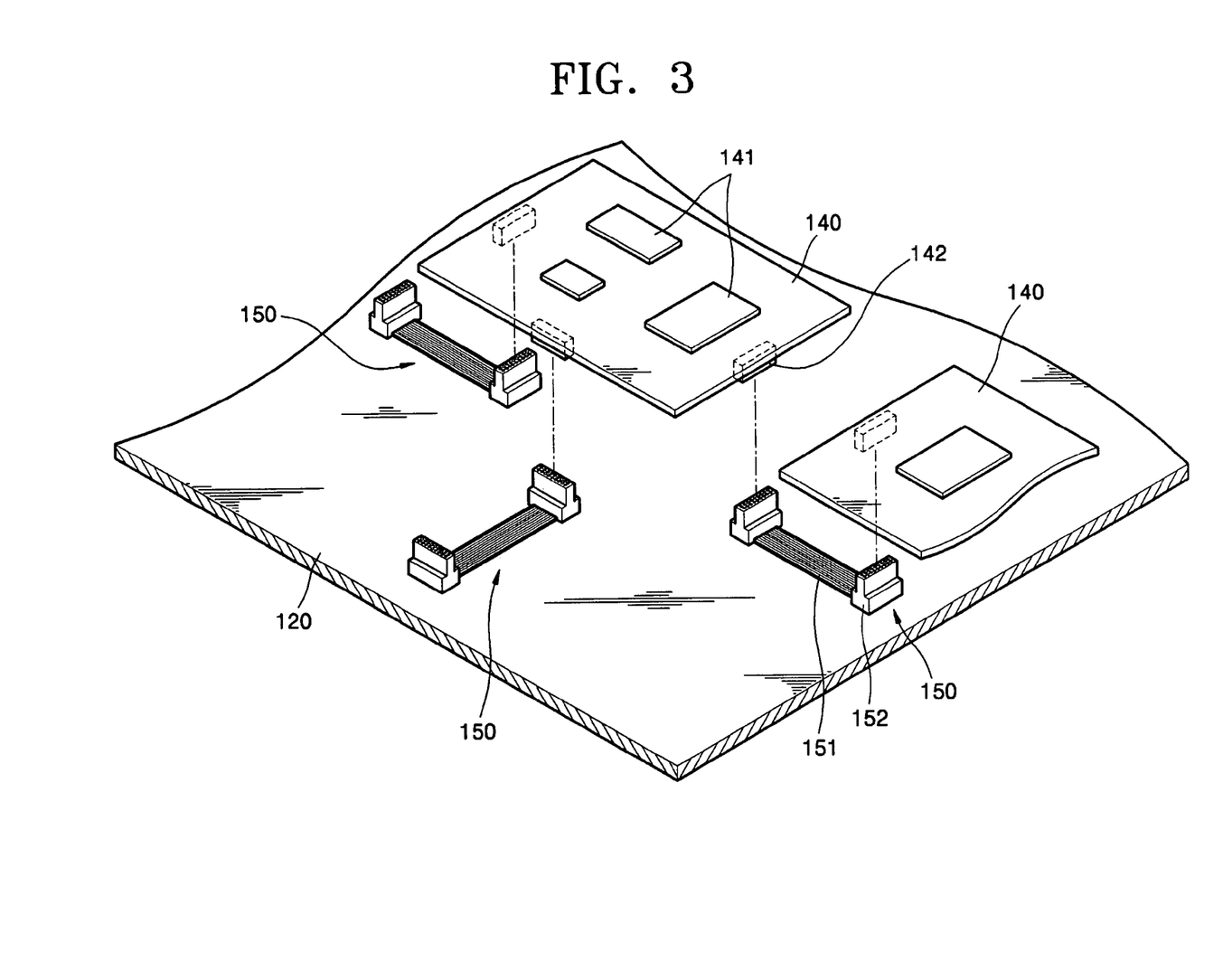
FIG. 3 is an exploded perspective view of an example of mounting printed circuit boards on a chassis base by connection cables in the plasma display apparatus of FIG. 2.

The printed circuit boards 140 are electrically connected to each other by connection cables 150, and the electrically connected printed circuit boards 140 are connected to the PDP 110 by the connection cables 150 to drive the PDP 110. Referring to FIG. 3, a substrate connector 142 is disposed on the printed circuit board 140 in order to electrically connect the board 140 to the PDP 110. The substrate connector 142 is fixedly mounted on the printed circuit board 140, and is connected to a circuit pattern formed on the printed circuit board 140. In addition, the connection cable 150 includes a wiring member 151 formed by disposing conductive lines on an insulating film, and two cable connectors 152 connected and coupled to both ends of the wiring member 151. In addition, the connection cable 150 connecting the PDP 110 to the printed circuit board 140 can include one cable connector 152 when one end of the wiring member 151 is connected to the electrodes formed on the PDP 110 by an anisotropic conductive film.

Figure 4:
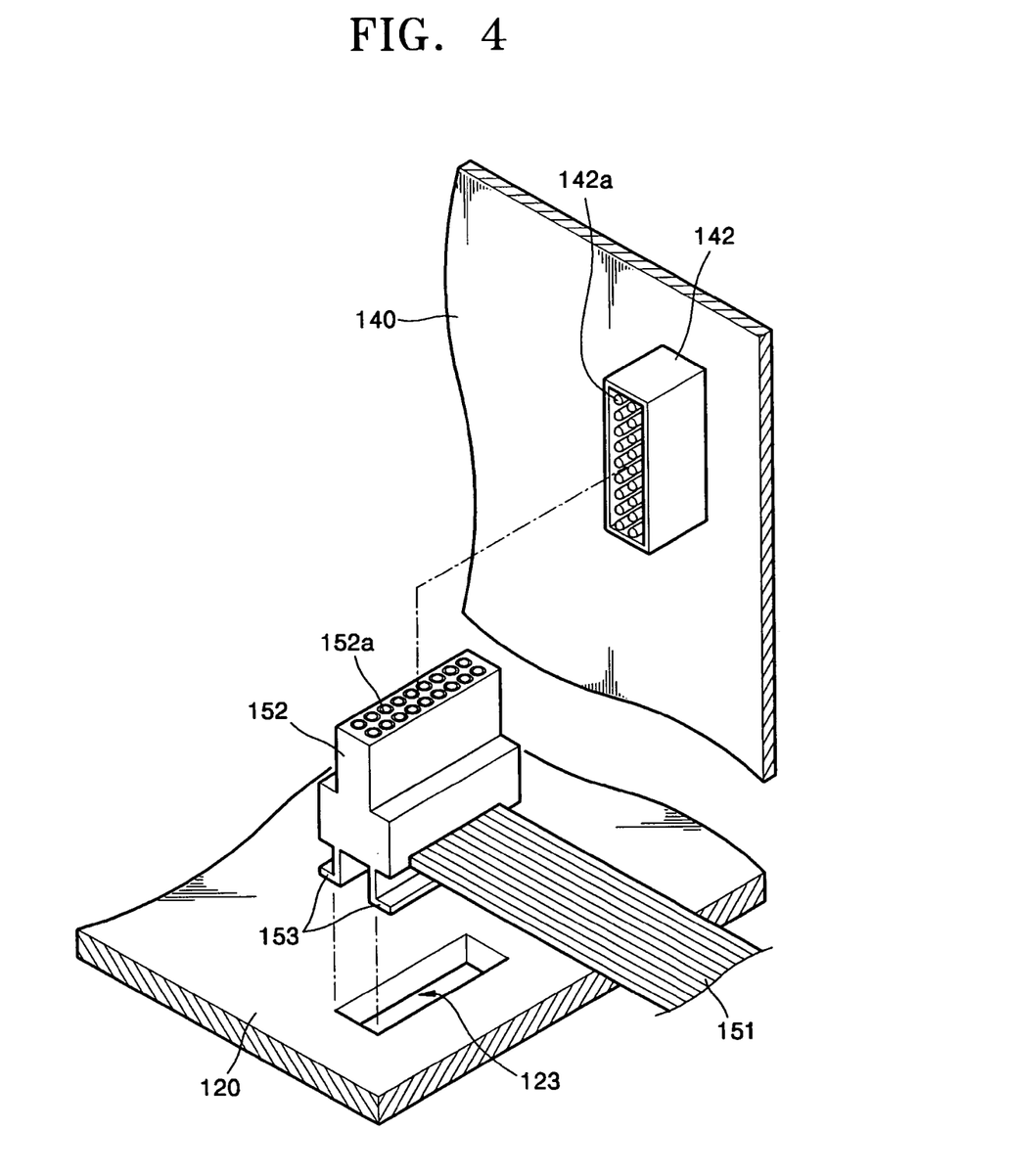
FIG. 4 is an exploded perspective view of a cable connector coupled to a substrate connector in the plasma display apparatus of FIG. 2.

Referring to FIG. 4, the cable connector 152 includes terminal holes 152a connected to the conductive lines formed on the wiring member 151 in a one-to-one correspondence, and the substrate connector 142 includes terminal pins 142a. The terminal pins 142a are inserted into the terminal holes 152a in a one-to-one correspondence, and thus, the cable connector 152 can be connected to the substrate connector 142. In addition, as shown in FIG. 4, the cable connector 152 is formed as a plug connector and the substrate connector 142 is formed as a socket connector so that the cable connector 152 and the substrate 142 can be firmly coupled to each other. However, on the contrary, the cable connector can be formed as the socket connector and the substrate connector is formed as the plug connector, or the cable connector can have the terminals pins and the substrate connector can have the terminal holes, and thus, the shapes of the connectors 142 and 152 are not limited to the above example.

The portion of the cable connector 152 where the terminal holes 152a are not formed is fixed onto the chassis base 120, and the substrate connector 142 is mounted on the front portion of the printed circuit board 140 so as to be coupled to the cable connector 152 that is fixed on the chassis base 120.

The cable connector 152 can be fixed onto the chassis base 120 by various units such as a mechanical joint or an additional member. For example, referring to FIGS. 4 and 5, the end portion of the cable connector 152 facing the chassis base 120 includes a pair of fixing units 153 formed as hooks, the chassis base 120 includes an insertion hole 123 so that a part of the fixing units 153 can pass through the insertion hole 123. In addition, the fixing units 153 are separated from each other and bent outward, and thus, concave portions respectively face the outside. Both edges of the insertion hole 123 formed on the chassis base 120 are inserted onto the concave portions of the fixing units 153 having the above structures, and thus, the cable connector 152 can be fixed onto the chassis base 120. Otherwise, the fixing units 153 of the cable connector 152 can be omitted, and then, a double-sided adhesive tape is disposed between the cable connector 152 and the chassis base 120 to fix the cable connector 152 onto the chassis base 120 using the double-sided adhesive tape. As described above, the cable connector 152 is installed to be adjacent to the chassis base 120, and then, a part of the circuit can be easily grounded to the chassis base 120 through the cable connector.

Figure 5:
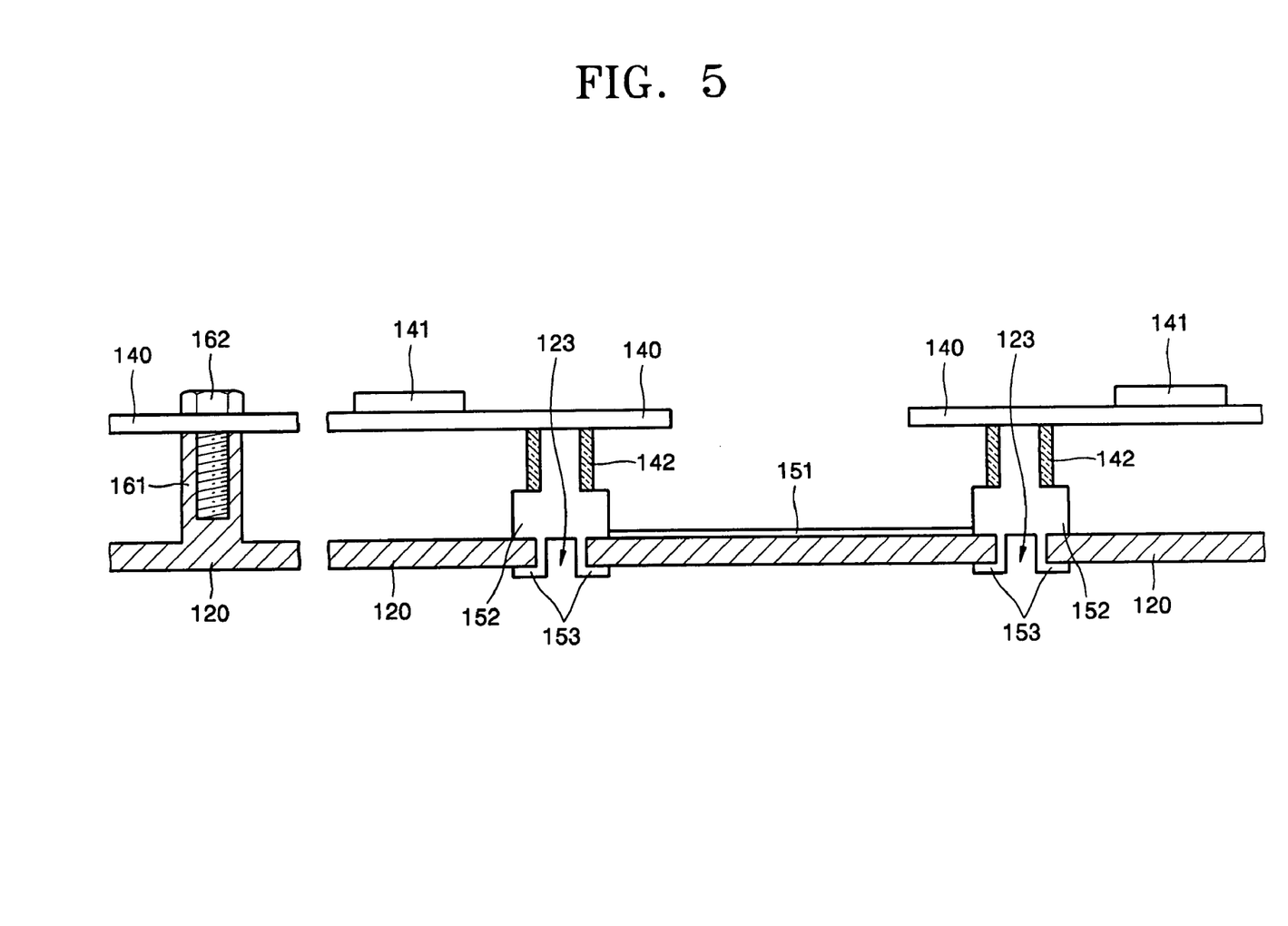
FIG. 5 is a side cross-sectional view of a part of the printed circuit boards mounted on the chassis base by the connection cable of FIG. 3.

When the cable connector 152 is fixed to the chassis base 120 as described above, the substrate connector 142 disposed on the front portion of the printed circuit board 140 is coupled to the cable connector 152 as shown in FIG. 5, and thus, the printed circuit board 140 can be mounted onto the chassis base 120 and the assembling can be improved. That is, the printed circuit board 140 is sufficiently affixed to the chassis base 120 by the coupling force between the terminal holes 152a and the terminal pins 142a and the coupling force between the cable connector 152 and the substrate connector 142. Therefore, additional bosses 11 of FIG. 1 are not required on the chassis base 10 in order to mount the printed circuit board 20 on the chassis base 10, and thus, processes and costs for forming the bosses 11 on the chassis 10 can be saved. Moreover, time for coupling the bosses 11 with screws 30 is not required, and damages that can occur to the printed circuit board 20 due to coupling the bosses with screws are avoided.

In addition, since the cable connectors 152 are respectively affixed to the chassis base 120 , the wiring member 151 between the cable connectors 152 of the connection cables 150 that connect between the printed circuit boards 140 contacts the rear surface of the chassis base 120 in parallel to the chassis base 120. Accordingly, the EMI can be reduced, and an additional process for attaching the wiring member 151 on the chassis base 120 to reduce the EMI and fix the wiring member can be omitted.

In addition, when the printed circuit board 140 cannot be sufficiently mounted on the chassis base 120 by the coupling force between the cable connector 152 and the substrate connector 142 due to various reasons such as a heavy weight of the printed circuit board 140, an auxiliary coupling unit can be further included. Referring to FIG. 5, an example of the auxiliary coupling unit can include a boss 161 formed on a rear surface of the chassis base 120, and a screw 162 penetrating through the printed circuit board 140 to be coupled to the boss 161. Even in this case, the number of bosses 161 can be reduced, and thus, the present invention is more efficient than the arrangement of FIG. 1 attaching the printed circuit board 20 on the chassis base 10 using only the bosses 11 in views of costs and processes.

As described above, according to the present invention, the printed circuit board can be mounted on the chassis base by only the coupling force between the cable connector and the substrate connector, and thus, processes can be reduced as compared to when the printed circuit board is mounted on the chassis base including additional bosses by screws. In addition, since the wiring member located between the cable connectors can contact the chassis base without passing through the rear portion of the printed circuit board, processes and costs for attaching the wiring member on the chassis base separately can be saved, and the EMI can be reduced. Moreover, since the cable connector is installed on the chassis base, it is easy to ground a part of the circuit onto the chassis base through the cable connector.

While the present invention has been particularly shown and described with reference to exemplary embodiments thereof, it will be understood by those of ordinary skill in the art that various modifications in form and detail can be made therein without departing from the spirit and scope of the present invention as defined by the following claims.

What is claimed is:

1. A plasma display apparatus, comprising:
a Plasma Display Panel (PDP) adapted to display images;
a chassis base arranged on a rear portion of the PDP;
printed circuit boards arranged on a rear portion of the chassis base and adapted to drive the PDP, the printed circuit boards including substrate connectors respectively arranged at front portions thereof; and
connection cables adapted to electrically connect the PDP to the printed circuit boards and to electrically connect the printed circuit boards to each other, the connection cables including a wiring member and a cable connector having two sides, wherein one side of the cable connector is affixed to the chassis base and the other side of the cable connector is coupled to one of the substrate connectors and to at least an end of the wiring member.

2. The apparatus of claim 1, wherein the chassis base and the cable connector are affixed to each other by a mechanical joint.

3. The apparatus of claim 2, wherein the chassis base and the cable connector are affixed to each other by an insertion hole arranged on the chassis base and a pair of fixing units arranged as hooks separated from each other, the hooks adapted to be inserted into both edges of the insertion hole.

4. The apparatus of claim 1, wherein the chassis base and the cable connector are affixed to each other by double-sided adhesive tape interposed therebetween.

5. The apparatus of claim 1, wherein one of the substrate connectors and the cable connectors comprises a socket connector and the other of the substrate connectors and the cable connectors comprises a plug connector, and wherein one substrate connector and one cable connector are coupled to each other.

6. The apparatus of claim 5, wherein one of the substrate connectors and the cable connector includes terminals holes, and the other of the substrate connectors and the cable connectors includes terminal pins adapted to be respectively inserted into the terminal holes.

7. The apparatus of claim 1, wherein the wiring member contacts the chassis base and is arranged parallel to the chassis base.

8. The apparatus of claim 1, wherein each printed circuit board is mounted onto the chassis base by coupling the substrate connector arranged on the printed circuit board to the cable connector arranged on the connection cable.

9. The apparatus of claim 8, further comprising an auxiliary coupling unit adapted to assist mounting the printed circuit board on the chassis base.

10. The apparatus of claim 9, wherein the auxiliary coupling unit includes a boss formed on a rear surface of the chassis base, and a screw penetrating the printed circuit board and adapted to be coupled to the boss.

* * * * *